(12) United States Patent
Lee et al.

(10) Patent No.: US 8,153,526 B2
(45) Date of Patent: Apr. 10, 2012

(54) HIGH PLANARIZING METHOD FOR USE IN A GATE LAST PROCESS

(75) Inventors: Shen-Nan Lee, Jhudong Township, Hsinchu County (TW); Huan-Just Lin, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 503 days.

(21) Appl. No.: 12/499,439

(22) Filed: Jul. 8, 2009

(65) Prior Publication Data
US 2010/0048007 A1 Feb. 25, 2010

Related U.S. Application Data

(60) Provisional application No. 61/090,424, filed on Aug. 20, 2008.

(51) Int. Cl.
*H01L 21/302* (2006.01)
*H01L 21/461* (2006.01)

(52) U.S. Cl. .......................... 438/692; 216/89
(58) Field of Classification Search .............. 216/89; 438/692
See application file for complete search history.

(56) References Cited

U.S. PATENT DOCUMENTS 7,037,821 B2 * 5/2006 Kim ............................ 438/622
2002/0168857 A1 * 11/2002 Kobayashi .................. 438/689
* cited by examiner

*Primary Examiner* — Roberts Culbert
(74) *Attorney, Agent, or Firm* — Haynes and Boone, LLP

(57) ABSTRACT

A method for performing a chemical-mechanical polishing (CMP) is provided. The method includes processing a semiconductor substrate to form a dummy gate structure on the substrate, to form a hard mask on the dummy gate structure, and to form a contact etch stop layer (CESL) and an interlayer dielectric (ILD) layer on the hard mask, performing a first CMP process with a first slurry to modify a non-planar topography of the ILD layer, performing a second CMP process with a second slurry to remove the hard mask, and performing a third CMP process with a third slurry to remove an interfacial layer that forms between the dummy gate and hard mask during semiconductor processing.

20 Claims, 5 Drawing Sheets

HIGH PLANARIZING METHOD FOR USE IN A GATE LAST PROCESS

PRIORITY DATA

This application claims priority to Provisional Application Ser. No. 61/090,424, filed on Aug. 20, 2008, entitled "A HIGH PLANARIZING METHOD FOR USE IN A GATE LAST PROCESS," the entire disclosure of which is incorporated herein by reference.

BACKGROUND

The present disclosure relates generally to the manufacturing of semiconductor devices, and more particularly to a chemical-mechanical polishing (CMP) process utilized in semiconductor manufacturing.

The semiconductor integrated circuit (IC) industry has experienced rapid growth. Technological advances in IC materials and design have produced generations of ICs where each generation has smaller feature sizes and more complex circuits than those from the previous generation. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. One approach that has been implemented is referred to as a gate last process or gate replacement process. In the gate last process, dummy poly gates are initially formed and may be followed by normal CMOS process flow until deposition of an interlayer dielectric (ILD). CMP is typically performed on the ILD layer to expose the dummy poly gates. The dummy poly gates may then be removed and replaced with true metal gates. However, it has been observed that the conventional CMP process suffers from gate height control and may cause defects to the underlying layers. This can lead to poor device performance and low wafer yield.

SUMMARY

One of the broader forms of an embodiment of the present invention involves a method for performing a chemical-mechanical polishing (CMP). The method includes processing a semiconductor substrate to form a dummy gate structure on the substrate, to form a hard mask on the dummy gate structure, and to form an interlayer dielectric (ILD) layer over the hard mask; performing a first CMP process with a first slurry to modify a non-planar topography of the ILD layer; performing a second CMP process with a second slurry to remove the hard mask; and performing a third CMP process with a third slurry to remove an interfacial that forms between the dummy gate and hard mask during the semiconductor processing.

Another one of the broader forms of an embodiment of the present invention involves a method for performing a chemical-mechanical polishing (CMP) on a semiconductor substrate having a dummy gate formed thereon, a hard mask formed on the dummy gate, and a contact etch stop layer (CESL) and an interlayer dielectric (ILD) layer formed over the hard mask. The method includes performing a first CMP process with a first slurry to planarize the ILD layer; performing a second CMP process with a second slurry to remove the CESL and the hard mask; and performing a third CMP process with a third slurry to remove an interfacial layer that forms between the dummy gate and hard mask during semiconductor processing.

Yet another one of the broader forms of an embodiment of the present invention involves a method for performing a multi-platen chemical mechanical polishing (CMP). The method includes processing a semiconductor substrate to form a dummy gate on the substrate, to form a hard mask on the dummy gate, and to form a contact etch stop layer (CESL) and an interlayer dielectric (ILD) layer over the substrate including the hard mask; performing a first CMP process to planarize the ILD layer, the first CMP process using a first platen and a first slurry; performing a second CMP process to remove the CESL and hard mask, the second CMP using a second platen and a second slurry, the second slurry having a selectivity greater than about 20; and performing a third CMP process to remove an interfacial layer that forms between the dummy gate and hard mask during the semiconductor processing, the third CMP using a third platen and a third slurry, the third slurry having a selectivity greater than about 3.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
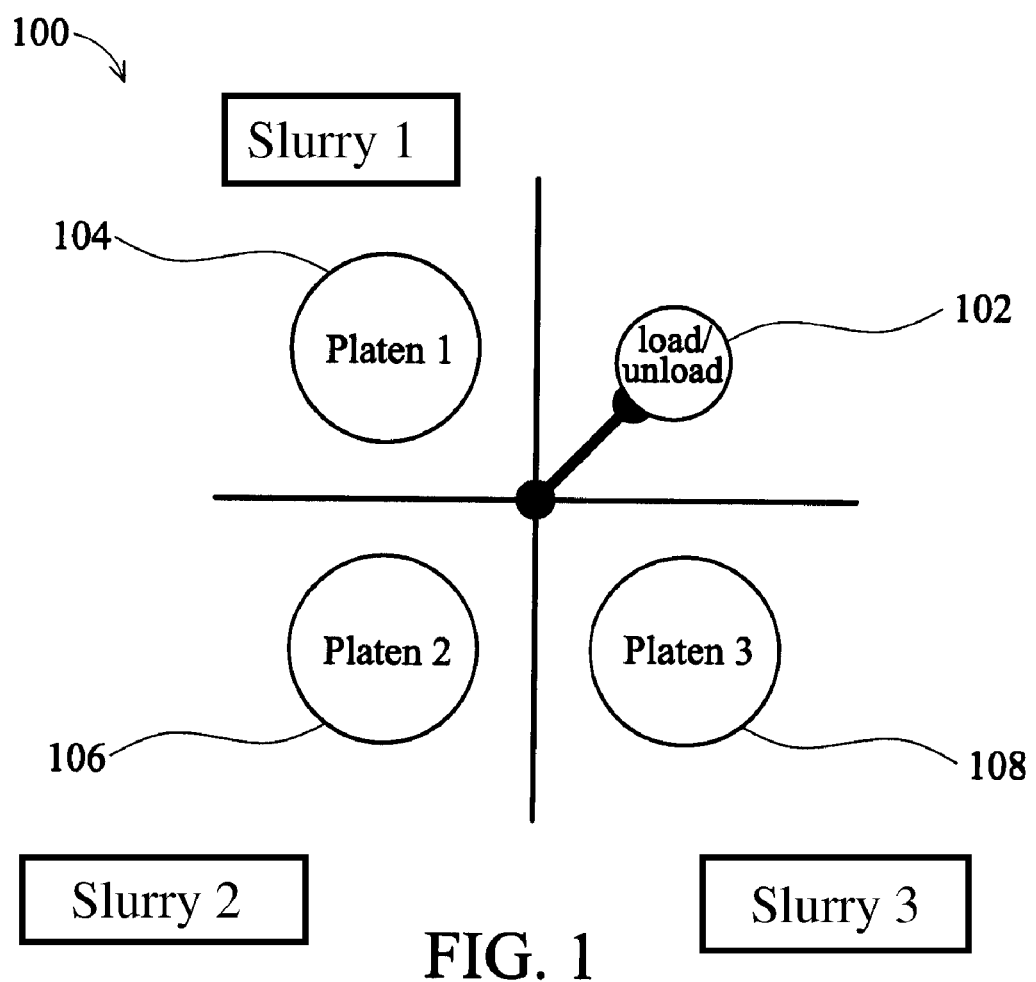
FIG. 1 is a diagrammatic top view of a CMP system for implementing one or more embodiments of the present disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a diagrammatic top view of an exemplary CMP rotary polisher system 100. The system 100 may include a four-station system, with one station 102 being used for loading and unloading, and the other three stations 104, 106, 108 including a platen (e.g., Platen 1, Platen 2, Platen 3) for separate CMP processing operations as will be discussed herein below. The system 100 may further include a robot arm 110 that may be used to transfer a substrate, such as a semiconductor wafer, from station to station. It is understood that the system 100 may include other features such as cassettes and input/output modules but is simplified for a better understanding of the inventive concepts of the present disclosure. Further, it is contemplated that CMP systems with other configurations of stations, platens, and robots may be used as well without departing from the spirit and scope of the present disclosure.

Figure 2:
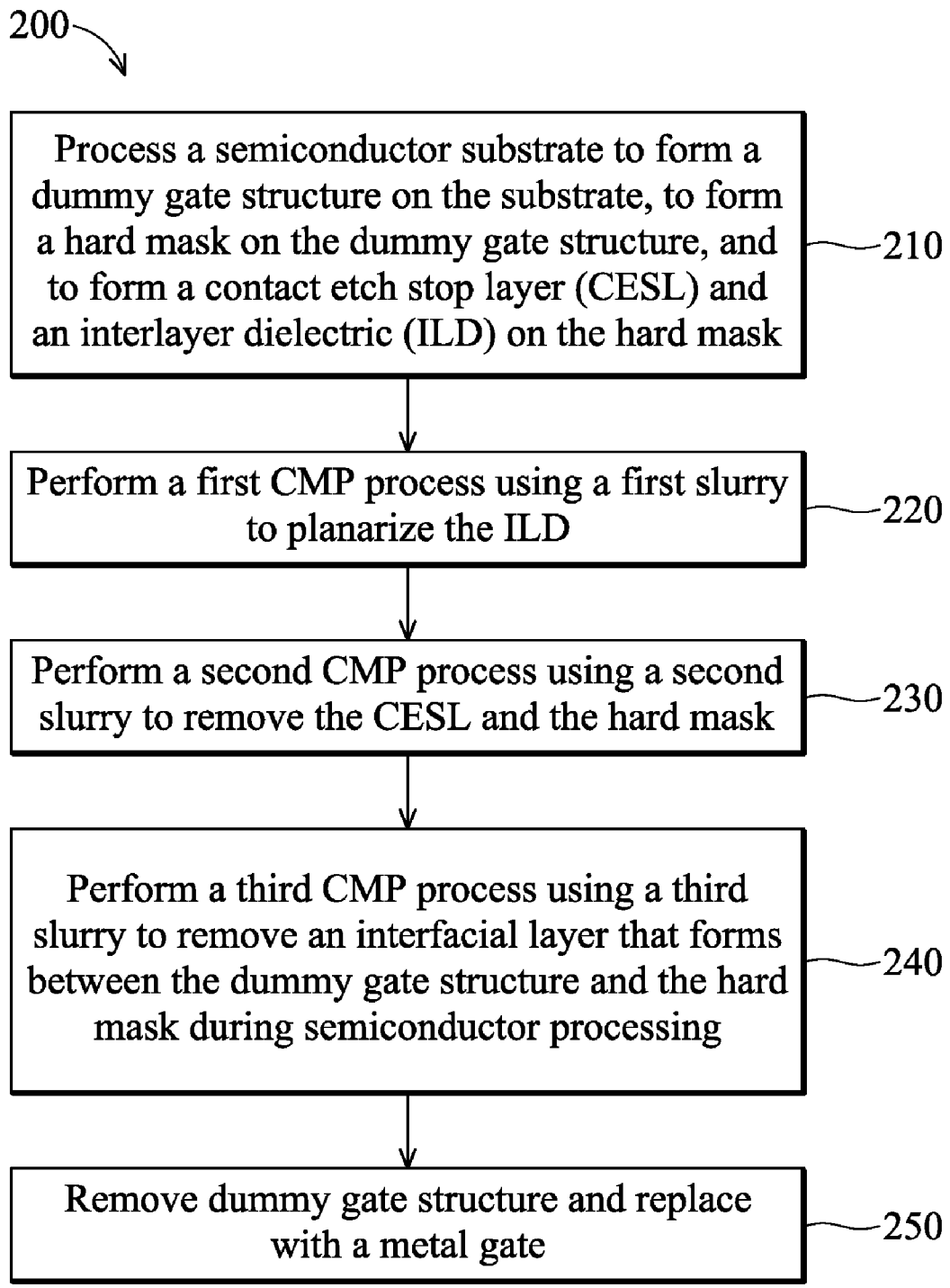
FIG. 2 is a flowchart of a method for performing a CMP in a gate last process according to various aspects of the present disclosure.

Referring to FIG. 2, illustrated is a flowchart of a method 200 for performing a CMP process on a semiconductor device in a gate last process according to various aspects of the present disclosure. Referring also to FIGS. 3A to 3E, illustrated are cross-sectional views of a semiconductor at various stages of fabrication according to the method 200 of FIG. 2. The system 100 (of FIG. 1) may be used to perform the method 200. In the gate last process, dummy poly gates of devices may be initially formed and may be followed by a CMOS process flow to form various structures (e.g., gate structures, lightly doped source/drain (LDD) regions, sidewall spacers, heavy doped source/drain regions, silicide features, etc.) until deposition of an interlayer dielectric (ILD) over the devices.

The method 200 begins with block 210 in which a semiconductor substrate may be processed to form a dummy poly gate structure on the substrate, to form a hard mask on the dummy poly gate structure, and to form a contact etch stop layer (CESL) and an interlayer dielectric (ILD) over the substrate including the hard mask.

Figure 3A:
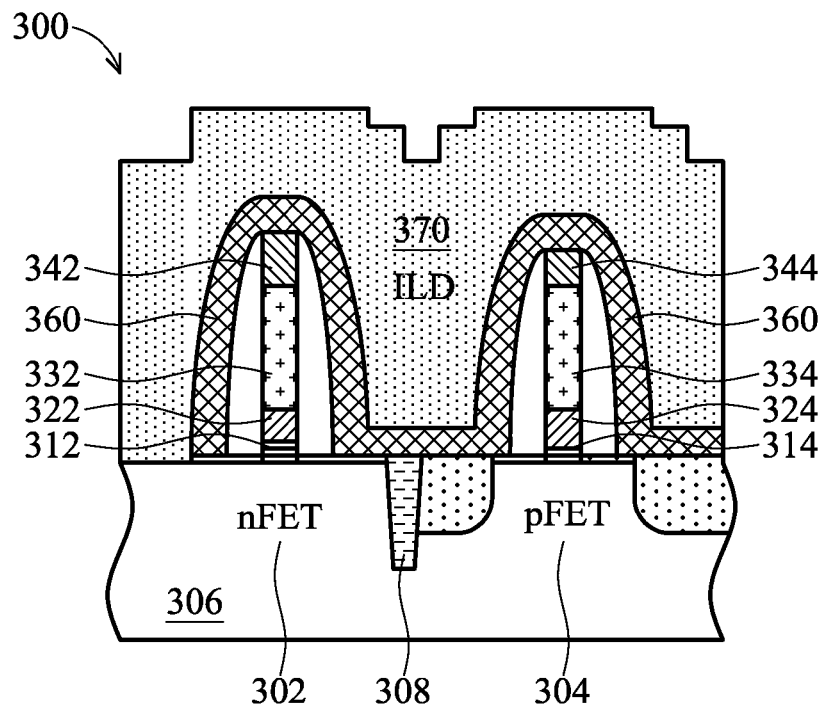
FIGS. 3A to 3E are cross-sectional views of a semiconductor device at various stages of fabrication according to the method of FIG. 2.

In FIG. 3A, the semiconductor device 300 may include regions 302 and 304 in which various microelectronic devices may be formed as part of an integrated circuit (IC). It is understood that the semiconductor device 300 may include memory devices (including but not limited to a static random access memory (SRAM)), logic devices (including but not limited to a metal-oxide semiconductor field-effect transistor (MOSFET)), and/or other devices. In the present example, the region 302 may include an N-channel field effect transistor (nFET) and the region 304 may include an P-channel FET (pFET). The transistors 302 and 304 may be formed by a CMOS process flow, and thus some processes and features are briefly described herein.

The semiconductor device 300 may include a semiconductor substrate 306 such as a silicon substrate. The substrate 306 may include various doping configurations depending on design requirements as is known in the art. The substrate 306 may also include other elementary semiconductors such as germanium and diamond. Alternatively, the substrate 306 may include a compound semiconductor and/or an alloy semiconductor. Further, the substrate 306 may optionally include an epitaxial layer (epi layer), may be strained for performance enhancement, and may include a silicon-on-insulator (SOI) structure. The semiconductor device 300 may further include an isolation structure 308 such as a shallow trench isolation (STI) feature formed in the substrate 306 for isolating the transistors 302 and 304. The isolation structure may be formed of silicon oxide, silicon nitride, silicon oxynitride, fluoride-doped silicate (FSG), and/or a low k dielectric material known in the art.

The transistors 302, 304 may each include a gate dielectric 312, 314. The gate dielectric 312, 314 may include a high-k dielectric material such as hafnium oxide ($HfO_2$). Alternatively, the gate dielectric 312, 314 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. Also, the gate dielectric 312, 314 may be formed on an interfacial layer, such as an oxide layer. Further, the transistors 302, 304 may further include a capping layer for tuning a work function of a metal layer (for the gate electrode) for properly performing as the nFET 302 and pFET 304, respectively. For example, the capping layer may include lanthanum oxide (LaOx), aluminum oxide (AlOx), magnesium oxide (MgOx), or other suitable materials.

The transistors 302, 304 may each further include a barrier or protection layer 322, 324 formed on the gate dielectric 312, 314, respectively. The barrier layer 322, 324 may include TiN, TaN, or other suitable material. The transistors 302, 304 may each further include a dummy poly gate structure 332, 334 formed on the barrier layer 322, 324, respectively. A hard mask 342, 344 may be formed on the poly structures 332, 334, respectively. The hard mask 342, 344 may include SiN, SiON, SiC, SiOC/PEOX, TEOS, or other suitable material. It is understood that the transistors 302, 304 may include various features such as sidewall spacers, source/drain regions including lightly doped source/drain regions and heavy doped source/drain regions, silicide features, and other features known in the art.

After formation of the various microelectronic devices and features in the substrate 306, a stressed layer such as a contact etch stop layer (CESL) 360 may be formed overlying the transistors 302, 304. The CESL 360 may be formed of silicon nitride, silicon oxynitride, silicon carbide, silicon oxycarbide, or other suitable materials. A dielectric layer such as an interlayer (or inter-level) dielectric (ILD) layer 370 may be formed overlying the CESL 360 by chemical vapor deposition (CVD), high density plasma CVD, spin-on, sputtering, or other suitable method. The ILD layer 370 may fill up conformably between the devices 302, 304 and in other regions over the substrate 306. The ILD layer 370 may include PSG, BPSG, $SiO_2$, TEOS, or other suitable material. As previously noted, in the gate last process, the dummy poly gate structures 332, 334 of transistors 302, 304 may be removed by an selective etch back process so that true metal gates may be formed to replace the dummy poly gate structures. Accordingly, the ILD layer 370 may be planarized by a CMP process until at a top portion of the dummy poly gate structures 332, 334 is reached as will be discussed in detail below.

Figure 3B:
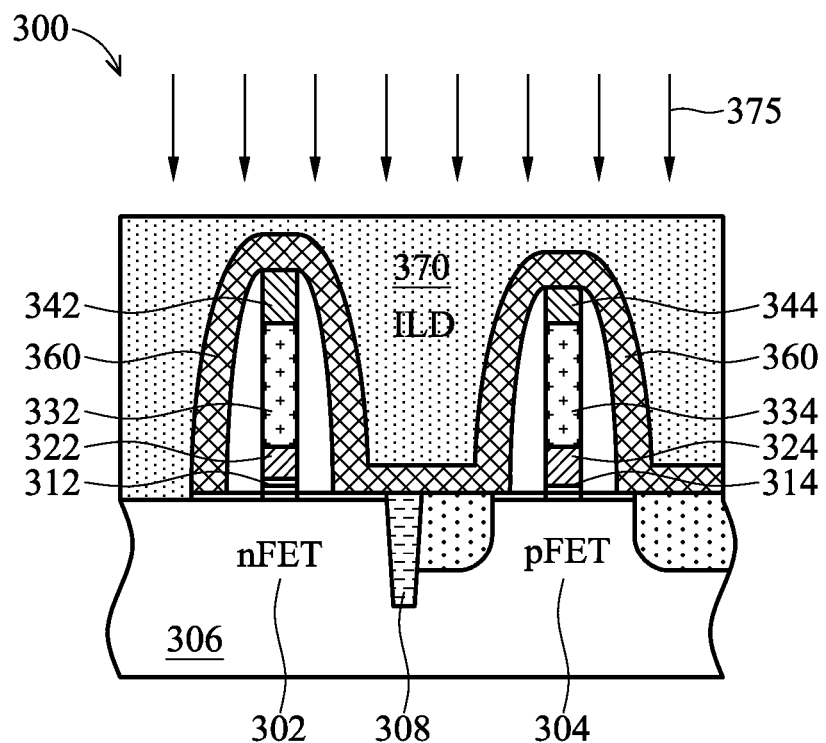

The method 200 continues with step 220 in which the semiconductor substrate may undergo a first CMP process using a first slurry and a first platen (e.g. Platen 1/Slurry 1 in FIG. 1). In FIG. 3B, the first CMP process 375 may be performed on the ILD layer 370 to remove a portion of the ILD layer and planarize the ILD layer. That is, initially the ILD layer 370 may have a non-planar surface or topography following the deposition process. Accordingly the first CMP process 375 may be performed to achieve a smooth and planar surface for the next CMP process discussed below.

Generally, a slurry includes small, abrasive particles of specific sizes and shapes suspended in an aqueous solution. The abrasive particles may be roughly as hard as the film that is to be polished. Acids or bases may be optionally added to the solution, depending on the material to be polished. The polishing rate may be affected by various slurry parameters, such as the chemical composition of the slurry solution, the concentration of the solid particles in the slurry, and the shape, size, and distribution of the slurry particles. An automatic slurry feeding system may be used to ensure the proper delivery of the slurry.

The first slurry is not required to have any selectivity since the first CMP process 375 is performed on the ILD layer 370 to achieve a planar and smooth surface. The first slurry may include an abrasive, such as fumed silica ($SiO_2$), in an aqueous solution. The aqueous solution may include an alkaline solution or other suitable solution. Accordingly, the first slurry may include a pH ranging from 9 to about 12. The silica may include particle sizes ranging from about 2 to about 50 nm. Further, the first slurry may include silica with a percentage ranging from about 10% to about 25%. Alternatively, the first slurry may optionally include alumina ($Al_2O_3$).

The first CMP process 375 may include the following process parameters. A rotational speed of the first platen may range from about 80 to about 120 rpm (rotation per minute). A polishing pressure may be applied between the semiconductor device 300 and the first platen, the pressure ranging from about 1.5 to about 5 psi (pound per square inch). The first slurry may be distributed onto the first platen at a rate of about 250 ml/min (milliliters per minute). The first CMP process 375 may include a timed polishing process ranging from about 60 to about 90 seconds. Alternatively, the first CMP process 375 may use an endpoint detection system as is known in the art for stopping the first CMP process. It has been observed that the removal rate of the first CMP process 375 on the ILD layer 370 is about 2200 angstrom (Å)/min. It is understood the specified removal rate may vary depending on the composition of the first slurry and the parameters of the first CMP process.

Figure 3C:
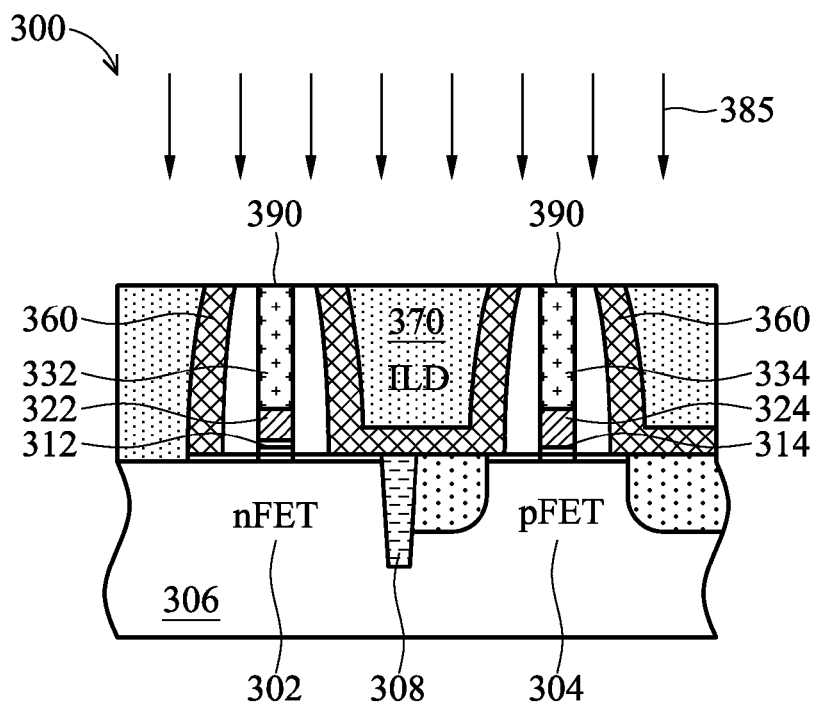
Figure 3D:
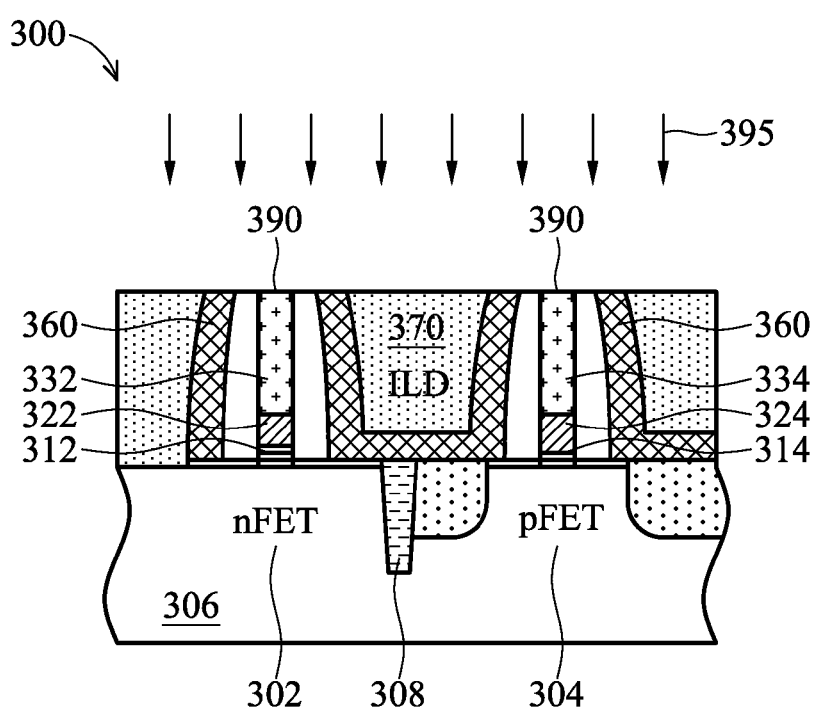

The method 200 continues with step 230 in which the semiconductor substrate may undergo a second CMP process using a second slurry and a second platen (e.g. Platen 2/Slurry 2 in FIG. 1). In some embodiments, an optional de-ionized water rinse or similar wet clean may be performed on the semiconductor device 300 in a station located between Platen 1 and Platen 2. In FIG. 3C, the second CMP process 385 may be performed on the semiconductor device 300 to remove the CESL 360 and the hard mask 342, 344 of the transistors 302, 304, respectively.

The second slurry may include a selectivity that is greater than about 20 with respect to an oxide and a silicon nitride (oxide:SiN) since the second CMP process 385 is performed to remove the hard mask 342, 344 and then stop. The second slurry may include an abrasive such as cerium oxide ($CeO_2$) in an aqueous solution. The second slurry may include a pH ranging from 4 to about 10. The cerium oxide may include particle sizes ranging from about 2 to about 50 nm. Further, the second slurry may include cerium oxide with a percentage ranging from about 0.1% to about 8%.

The second CMP process 385 may include the following process parameters. A rotational speed of the second platen may range from about 60 to about 120 rpm (rotation per minute). A polishing pressure may be applied between the semiconductor device 300 and the second platen, the pressure ranging from about 1.5 to about 5 psi (pound per square inch). The second slurry may be distributed onto the second platen at a rate of about 250 ml/min (milliliters per minute). The second CMP process 385 may include a timed polishing process ranging from about 200 to about 400 seconds. However, other polishing time periods may also be used. Alternatively, the second CMP process 385 may use an endpoint detection system as is known in the art for stopping the second CMP process. It has been observed that the removal rate of the second CMP process 385 on the oxide is about 3600 angstrom (Å)/min, and on the SiN is about 130 angstrom (Å)/min. It is understood the specified removal rates may vary depending on the composition of the second slurry and the parameters of the second CMP process.

The method 200 continues with step 240 in which the semiconductor substrate may undergo a third CMP process using a third slurry and a third platen (e.g. Platen 3/Slurry 3 in FIG. 1). In some embodiments, an optional de-ionized water rinse or similar wet clean may be performed on the semiconductor device 300 in a station located between Platen 2 and Platen 3. It has been observed that an interfacial layer 390 forms between the dummy poly gate 332, 334 and the hard mask 342, 344 during the CMOS process flow. In other words, an oxide-like interface layer forms between the polysilicon layer (of the dummy poly gate) and the silicon nitride layer (of the hard mask) during processing of the semiconductor device 300. Accordingly, following the second CMP process 385 to remove the hard mask 342, 344, the interfacial layer 390 may be exposed but covers the dummy poly gate structures 332, 334. In FIG. 3C, the third CMP process 395 may be performed on the semiconductor device 300 to remove the interfacial layer 390.

The third slurry may include a selectivity that is greater than about 3 with respect to a poly and an oxide (poly:oxide) since the third CMP process 395 is performed to remove the oxide-like interfacial layer 390. The third slurry may include an abrasive such as fumed silica ($SiO_2$) in an aqueous solution. The aqueous solution may include an alkaline solution or other suitable basic solution. Accordingly, the third slurry may include a pH ranging from 9 to about 12. The silica may include particle sizes ranging from about 2 to about 50 nm. Further, the third slurry may include silica with a percentage ranging from about 0.5% to about 12%.

The third CMP process 395 may include the following process parameters. A rotational speed of the third platen may range from about 40 to about 90 rpm (rotation per minute). A polishing pressure may be applied between the semiconductor device 300 and the third platen, the pressure ranging from about 0.3 to about 3 psi (pound per square inch). The third slurry may be distributed onto the third platen at a rate of about 250 ml/min (milliliters per minute). The third CMP process 395 may include a timed polishing process ranging from about 5 to about 15 seconds. However, other polishing time periods may also be used. Alternatively, the third CMP process 395 may use an endpoint detection system as is known in the art for stopping the third CMP process. It has been observed that the removal rate of the third CMP process 395 on the poly is about 1600 angstrom (Å)/min, and on the oxide is about 490 angstrom (Å)/min. It is understood the specified removal rates may vary depending on the composition of the third slurry and the parameters of the third CMP process.

Following the third CMP process 395, an optional wafer rinse and platen rinse may be performed during the unloading of the semiconductor device 300 from the CMP system 100 (of FIG. 1). Further, a top surface of the dummy poly gate structures 332, 334 is exposed and ready for removal. Moreover, the gate height of the transistors 302, 304 can be well controlled without over-polishing and decreasing the gate height.

The method 200 continues with block 250 in which the dummy poly gate structures 332, 334 may be removed and replaced with metal gates. For example, the dummy poly gate structures may be removed by an etch process thereby forming trenches, and the trenches (gate) may be filled with one or more metal layers. The polysilicon is selectively etched by exposure to hydroxide containing solution (e.g., ammonium hydroxide), de-ionized water, and/or other suitable solutions. Thereafter, additional processing may be performed to complete fabrication of the semiconductor device such as, CMP on the metal layers, forming contacts/vias, forming a multi-layer interconnection structure including metal layers and inter-level dielectric, forming passivation layer, and so forth.

Figure 3E:
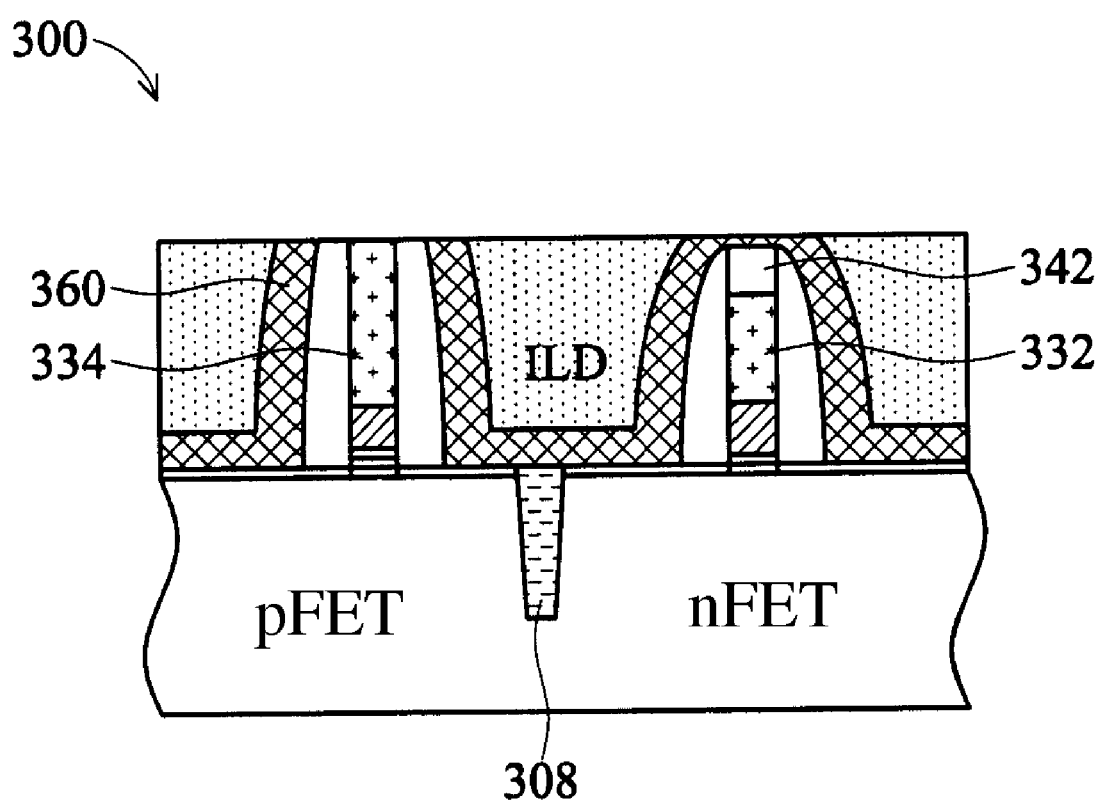

In FIG. 3E, it has been contemplated that the method 200 may be implemented in applications where the dummy poly gate in only one type of device (e.g., nFET or pFET) side is exposed. For example, the method 200 may be implemented to only open the pFET device side while leaving the nFET side closed. In other words, the dummy poly gate 334 in the pFET device side may be exposed while a portion of the CESL 360 and the hard mask 342 remain in the nFET device side. Thereafter, a CMP process may be performed to open the nFET device side. In another example, the method 200 may be implemented to only open the nFET device side while leaving the pFET side closed. Thus, the dummy poly gate in the nFET device side may be exposed while a portion of the CESL and hard mask remain in the pFET device side. Thereafter, a CMP process may be performed to open pFET device side.

Additionally, it is contemplated that various additives may be added to the slurries disclosed herein. In some embodiments, the additives may include organic additives such as organic acid, EDTA, surfactant, and chelating agent. In other embodiments, the additives may include inorganic additives such as acid/alkali buffer and ionic strength agent. In some other embodiments, a selectivity control agent may be added to the slurries disclosed herein. The selectivity control agent may include C-rich surfactant, F-rich surfactant, and OH-rich surfactant. Also, yet other embodiments, the abrasive particles may include various types such as fumed, colloidal, and hybrid (e.g., hybrid polymer abrasive).

In summary, the methods disclosed herein may be used in a gate replacement process with a high-topography gate stack (including a dummy gate process). A contact etch stop layer (CESL) and an interlayer dielectric (ILD) layer may deposited over the devices (nFET and pFET, or NMOS and PMOS, or CMOS) and filling in gaps between the devices. First, a topography slurry may be used on the ILD layer to achieve a smooth and low-topography surface. Second, a high planarity slurry may be used to remove the CESL and hard mask on the dummy gate. Third, a selective slurry may be used to modify the dummy gate surface so as to remove an interfacial layer that forms between the dummy gate and the hard mask during semiconductor processing. Thus, the methods disclosed herein provide a controllable and uniform dummy gate removal process for the gate last process.

Thus, a method for performing a chemical-mechanical polishing (CMP) includes processing a semiconductor substrate to form a dummy gate structure on the substrate, to form a hard mask on the dummy gate structure, and to form an interlayer dielectric (ILD) layer over the hard mask, performing a first CMP process with a first slurry to modify a non-planar topography of the ILD layer, performing a second CMP process with a second slurry to remove the hard mask, and performing a third CMP process with a third slurry to remove an interfacial that forms between the dummy gate and hard mask during the semiconductor processing. In some embodiments, the first slurry includes silica ($SiO_2$) with a percentage ranging from about 10% to about 25%, and a pH ranging from about 9 to about 12. In other embodiments, the first CMP process includes one of a slurry distribution of about 250 ml/min, a rotational speed ranging from about 80 to about 120 rpm, a polishing pressure ranging from about 1.5 to about 5 psi, and a time period ranging from about 60 to about 90 seconds. In some other embodiments, the first slurry has no selectivity.

In yet other embodiments, the second slurry includes cerium oxide ($CeO_2$) having a percentage ranging from about 0.1% to about 8%, and a pH ranging from about 4 to about 10. In some embodiments, the second CMP process includes one of a slurry distribution of about 250 ml/min, a rotational speed ranging from about 60 to about 120 rpm, a polishing pressure ranging from about 1.5 to about 5 psi, and a time period ranging from about 200 to about 400 seconds. In other embodiments, the second slurry has a selectivity that is greater than about 20. In some other embodiments, the third slurry includes silica ($SiO_2$) having a percentage ranging from about 0.5% to about 12%, and a pH ranging from about 9 to about 12. In other embodiments, the third CMP process includes one of a slurry distribution of about 250 ml/min, a rotational speed ranging from about 40 to about 90 rpm, a polishing pressure ranging from about 0.3 to about 3 psi, and a time period ranging from about 5 to about 15 seconds. In still other embodiments, the third slurry has a selectivity that is greater than about 3.

Also provided is a method for performing a chemical-mechanical polishing (CMP) on a semiconductor substrate having a dummy gate formed thereon, a hard mask formed on the dummy gate, and a contact etch stop layer (CESL) and an interlayer dielectric (ILD) layer formed over the hard mask. The method includes performing a first CMP process with a first slurry to planarize the ILD layer, performing a second CMP process with a second slurry to remove the CESL and the hard mask, and performing a third CMP process with a third slurry to remove an interfacial layer that forms between the dummy gate and hard mask during semiconductor processing. In some embodiments, the first slurry includes silica ($SiO_2$) with a percentage ranging from about 10% to about 25%, and a pH ranging from about 9 to about 12. In other embodiments, the second slurry includes cerium oxide ($CeO_2$) having a percentage ranging from about 0.1% to about 8%, and a pH ranging from about 4 to about 10. In some other embodiments, the third slurry includes silica ($SiO_2$) having a percentage ranging from about 0.5% to about 12%, and a pH ranging from about 9 to about 12. In yet other embodiments, the first, second, and third slurries each include one of an organic acid, EDTA, surfactant, chelating agent, acid/alkali buffer, ionic strength agent, C-rich surfactant, F-rich surfactant, and OH-rich surfactant. In some embodiments, the method further includes after performing the third CMP process, removing the dummy gate and replacing it with a metal gate.

Further, provided is a method for performing a multi-platen chemical mechanical polishing (CMP) that includes processing a semiconductor substrate to form a dummy gate on the substrate, to form a hard mask on the dummy gate, and to form a contact etch stop layer (CESL) and an interlayer dielectric (ILD) layer over the substrate including the hard mask, performing a first CMP process to planarize the ILD layer, the first CMP process using a first platen and a first slurry, performing a second CMP process to remove the CESL and hard mask, the second CMP using a second platen and a second slurry, the second slurry having a selectivity greater than about 20, and performing a third CMP process to remove an interfacial layer that forms between the dummy gate and hard mask during the semiconductor processing, the third CMP using a third platen and a third slurry, the third slurry having a selectivity greater than about 3. In some embodiments, the second slurry has the selectivity with respect to an oxide and a nitride. In other embodiments, the third slurry has the selectivity with respect to a polysilicon and an oxide. In still other embodiments, the first slurry includes silica ($SiO_2$) with a percentage ranging from about 10% to about 25%, and a pH ranging from about 9 to about 12, the second slurry includes cerium oxide ($CeO_2$) having a percentage ranging from about 0.1% to about 8%, and a pH ranging from about 4 to about 10, and the third slurry includes silica ($SiO_2$) having a percentage ranging from about 0.5% to about 12%, and a pH ranging from about 9 to about 12.

The present invention achieves different advantages in various embodiments disclosed herein. For example, the present disclosed method provides a simple and cost-effective method for performing a CMP process in a gate last process. Accordingly, the gate height can be well controlled in the gate last process without over-polishing and decreasing the gate height. Also, a risk of damaging the underlying layers during the CMP process is reduced. Thus, the performance of the device becomes more predictable and reliable. Moreover, the cost of production may be decreased and the wafer throughput may be increased. It is understood that different embodiments disclosed herein offer different advantages, and that no particular advantage is necessarily required for all embodiments.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure. For example, although the methods disclosed herein are used in a gate last process, the methods may also be used in a hybrid process that includes a gate first process and a gate last process. In other words, a metal gate of some of the devices (e.g., NMOS or PMOS devices) may be formed in a gate first process and a metal gate of some other devices (e.g., PMOS or NMOS devices) may be formed in a gate last process.

What is claimed is:

1. A method for performing a chemical-mechanical polishing (CMP), comprising:
   processing a semiconductor substrate to form a dummy gate structure on the substrate, to form a hard mask on the dummy gate structure, and to form an interlayer dielectric (ILD) layer over the hard mask;
   performing a first CMP process with a first slurry to modify a non-planar topography of the ILD layer;
   performing a second CMP process with a second slurry to remove the hard mask; and
   performing a third CMP process with a third slurry to remove an interfacial that forms between the dummy gate and hard mask during the semiconductor processing.

2. The method of claim 1, wherein the first slurry includes silica ($SiO_2$) with a percentage ranging from about 10% to about 25%, and a pH ranging from about 9 to about 12.

3. The method of claim 2, wherein the first CMP process includes one of a slurry distribution of about 250 ml/min, a rotational speed ranging from about 80 to about 120 rpm, a polishing pressure ranging from about 1.5 to about 5 psi, and a time period ranging from about 60 to about 90 seconds.

4. The method of claim 2, wherein the first slurry has no selectivity.

5. The method of claim 1, wherein the second slurry includes cerium oxide ($CeO_2$) having a percentage ranging from about 0.1% to about 8%, and a pH ranging from about 4 to about 10.

6. The method of claim 4, wherein the second CMP process includes one of a slurry distribution of about 250 ml/min, a rotational speed ranging from about 60 to about 120 rpm, a polishing pressure ranging from about 1.5 to about 5 psi, and a time period ranging from about 200 to about 400 seconds.

7. The method of claim 4, wherein the second slurry has a selectivity that is greater than about 20.

8. The method of claim 1, wherein the third slurry includes silica ($SiO_2$) having a percentage ranging from about 0.5% to about 12%, and a pH ranging from about 9 to about 12.

9. The method of claim 6, wherein the third CMP process includes one of a slurry distribution of about 250 ml/min, a rotational speed ranging from about 40 to about 90 rpm, a polishing pressure ranging from about 0.3 to about 3 psi, and a time period ranging from about 5 to about 15 seconds.

10. The method of claim 6, wherein the third slurry has a selectivity that is greater than about 3.

11. A method for performing a chemical-mechanical polishing (CMP) on a semiconductor substrate having a dummy gate formed thereon, a hard mask formed on the dummy gate, and a contact etch stop layer (CESL) and an interlayer dielectric (ILD) layer formed over the hard mask, the method comprising:
    performing a first CMP process with a first slurry to planarize the ILD layer;
    performing a second CMP process with a second slurry to remove the CESL and the hard mask; and
    performing a third CMP process with a third slurry to remove an interfacial layer that forms between the dummy gate and hard mask during semiconductor processing.

12. The method of claim 11, wherein the first slurry includes silica ($SiO_2$) with a percentage ranging from about 10% to about 25%, and a pH ranging from about 9 to about 12.

13. The method of claim 11, wherein the second slurry includes cerium oxide ($CeO_2$) having a percentage ranging from about 0.1% to about 8%, and a pH ranging from about 4 to about 10.

14. The method of claim 11, wherein the third slurry includes silica ($SiO_2$) having a percentage ranging from about 0.5% to about 12%, and a pH ranging from about 9 to about 12.

15. The method of claim 11, wherein the first, second, and third slurries each include one of an organic acid, EDTA, surfactant, chelating agent, acid/alkali buffer, ionic strength agent, C-rich surfactant, F-rich surfactant, and OH-rich surfactant.

16. The method of claim 11, further comprising, after performing the third CMP process, removing the dummy gate and replacing it with a metal gate.

17. A method for performing a multi-platen chemical mechanical polishing (CMP), comprising:
    processing a semiconductor substrate to form a dummy gate on the substrate, to form a hard mask on the dummy gate, and to form a contact etch stop layer (CESL) and an interlayer dielectric (ILD) layer over the substrate including the hard mask;
    performing a first CMP process to planarize the ILD layer, the first CMP process using a first platen and a first slurry;
    performing a second CMP process to remove the CESL and hard mask, the second CMP using a second platen and a second slurry, the second slurry having a selectivity greater than about 20; and
    performing a third CMP process to remove an interfacial layer that forms between the dummy gate and hard mask during the semiconductor processing, the third CMP using a third platen and a third slurry, the third slurry having a selectivity greater than about 3.

18. The method of claim 17, wherein the second slurry has the selectivity with respect to an oxide and a nitride.

19. The method of claim 17, wherein the third slurry has the selectivity with respect to a polysilicon and an oxide.

20. The method of claim 17, wherein:
the first slurry includes silica ($SiO_2$) with a percentage ranging from about 10% to about 25%, and a pH ranging from about 9 to about 12;
the second slurry includes cerium oxide ($CeO_2$) having a percentage ranging from about 0.1% to about 8%, and a pH ranging from about 4 to about 10; and
the third slurry includes silica ($SiO_2$) having a percentage ranging from about 0.5% to about 12%, and a pH ranging from about 9 to about 12.

* * * * *